(12) United States Patent
Ishizuka et al.

(10) Patent No.: US 7,868,435 B2
(45) Date of Patent: Jan. 11, 2011

(54) ADHESIVE CONTAINING A FILLER, AND A METHOD FOR ATTACHING AND MANUFACTURING A THIN PLATE USING THE SAME

(75) Inventors: Masaharu Ishizuka, Toumi (JP); Shigeru Shoji, Tokyo (JP)

(73) Assignee: TDK Corporation, Tokyo (JP)

( * ) Notice: Subject to any disclaimer, the term of this patent is extended or adjusted under 35 U.S.C. 154(b) by 742 days.

(21) Appl. No.: 11/298,683

(22) Filed: Dec. 12, 2005

(65) Prior Publication Data

US 2006/0159930 A1 Jul. 20, 2006

(30) Foreign Application Priority Data

Dec. 13, 2004 (JP) .............................. 2004-359812

(51) Int. Cl.
- *H01L 23/00* (2006.01)
- *B32B 27/38* (2006.01)
- *C09J 163/00* (2006.01)
- *C08L 63/00* (2006.01)
- *B32B 15/092* (2006.01)

(52) U.S. Cl. ........................ 257/678; 156/330; 257/679; 428/414; 428/416; 523/440

(58) Field of Classification Search ................. 523/440, 523/457; 428/413, 414, 415, 416, 417, 418; 257/678, 679; 156/330

See application file for complete search history.

(56) References Cited

U.S. PATENT DOCUMENTS

2002/0070048 A1 * 6/2002 Kumakura .................. 174/260

FOREIGN PATENT DOCUMENTS

| JP | 05-059158 A | | 3/1993 |
|----|-------------|---|--------|
| JP | 06-025512 A | | 2/1994 |
| JP | 06-136341 A | | 5/1994 |
| JP | 09-102567 A | | 4/1997 |
| JP | 10-294403 A | * | 11/1998 |
| JP | 11-066953 A | * | 3/1999 |
| JP | 2000-003987 A | | 1/2000 |
| JP | 2001-298147 A | * | 10/2001 |

OTHER PUBLICATIONS

Machine translation of JP 11-066953 A, provided by the JPO website (1999).*
Partial translation of JP 11-066953 A (paragraphs 0026-0028), provided by the USPTO translations branch.*
Machine translation of JP 10-294403 A, provided by the JPO website.*
Machine translation of JP 2001-298147 A, provided by the JPO website.*

* cited by examiner

*Primary Examiner*—Michael J Feely
(74) *Attorney, Agent, or Firm*—Oliff & Berridge, PLC

(57) ABSTRACT

An adhesive comprises a base material which generates adhesive strength through curing, a hardening agent which promotes the curing of the base material, and a filler. In order to solve the problems mentioned above, the adhesive is made of particles having a maximum particle diameter of 0.8 μm or less.

12 Claims, 6 Drawing Sheets

ADHESIVE CONTAINING A FILLER, AND A METHOD FOR ATTACHING AND MANUFACTURING A THIN PLATE USING THE SAME
=======================================================================================================

This Application is an U.S. Nonprovisional Utility Patent Application that claims foreign priority, pursuant to 35 U.S.C. §119, from Japanese Patent Application No. 2004-359812 filed Dec. 13, 2004, the complete disclosure of which is incorporated herein by reference.

BACKGROUND OF THE INVENTION
---------------------------

1. Field of the Invention

This invention relates to an adhesive which is used to attach a thin plate to a board, and to a method for attaching a thin plate to a board. This invention particularly relates to an adhesive and a method which are used to attach a chip portion to a reinforcing plate in a process for manufacturing non-contact IC cards. Moreover, the present invention relates to a protective film that is used to process a chip portion thin, and a method for processing a chip portion thin.

2. Description of the Related Art

Non-contact type IC cards have been used in a variety of fields, such as railroad ticket gates, and are expected to be applied in a lot of fields in the future. A non-contact type IC card has an antenna for communication, a semiconductor chip (IC chip), and a sheet material to cover the antenna and the chip. An IC chip includes a chip portion and a reinforcing plate, which is normally made of stainless steel, to support the chip portion. The chip portion has a substrate made of silicon etc., and laminated films which are stacked thereon to form a circuit. The reinforcing plate has a function of protecting the chip portion against excessive deformation, and also has a function as a heat sink which absorbs heat that is generated by the chip portion.

Various methods for manufacturing an IC chip have been proposed. According to one method, first, a wafer, on which a plurality of chip portions are formed, is processed so that it is thinner from the back side of the wafer. Next, the thin wafer is diced into chip portions. Then, the separated chip portion is attached to a reinforcing plate in order to manufacture an IC chip. In order to attach a separated chip portion to a reinforcing plate, first, a plurality of reinforcing plates are held on a base, with the sides on which an adhesive is to be applied facing upward. Next, an adhesive is applied on the surface on which the adhesive is to be applied, and a chip portion is attached to the surface on which the adhesive has been applied. Thermosetting resins, such as epoxy resin, are often used as an adhesive. An adhesive made of a thermosetting resin is cured by heating the adhesive at a predetermined temperature and for a predetermined time in that state, and the IC chip is bonded to the reinforcing plate. For an epoxy resin, the predetermined time is 2 hours, and the predetermined temperature is 120 degrees centigrade.

In order to provide an adhesive with thermal and electrical conductivity after curing, an adhesive may contain a filler, as well as base material such as an epoxy resin, and a hardening agent to produce a rapid cure. A spherical filler having a diameter of 5 μm or less, and a scale-shaped filler having a thickness of 5 μm or less are disclosed in the specification etc. of Japanese Patent Laid-open Publication No. 2000-136341. A filler which has scale-shaped graphite powder having a maximum particle diameter of 100 μm or less and which has spherical copper powder that is covered with carbon and that has a maximum particle-diameter of 20 μm or less is disclosed In the specification etc. of Japanese Patent Laid-open Publication No. 2000-3987. A filler which has silica powder with a maximum particle diameter of 1-20 μm and which has a hydrophobic super fine silica powder with an average particle size of 2-50 nm is disclosed in the specification etc. of Japanese Patent Laid-open Publication No. 59158/93. Silica powder which has an average particle diameter of 1-20 μm and a maximum particle diameter of 50 μm or less is disclosed in the specification etc. of Japanese Patent Laid-open Publication No. 25512/94.

However, there are the following drawbacks in prior art. Specifically, thermosetting resins, which are often used as an adhesive for an IC chip, tend to gradually contract, i.e., tend to experience volumetric contraction, as curing progresses. FIGS. 1A, 1B show sectional views of a laminated structure consisting of a chip portion, a reinforcing plate, and an adhesive, when a chip portion is attached to a reinforcing plate according to prior art As shown in FIG. 1A, adhesive S is applied to surface H1 of flat reinforcing plate H. and chip portion C is attached to upper surface S1 of adhesive S. Reinforcing plate H, adhesive S, and chip portion C form layers that are parallel to each other and that do not have out-of-the-plane strain, immediately after chip portion C is attached to adhesive S, as shown in FIG. 1A. However, adhesive S begins to produce volumetric contraction in accordance with polymerization of adhesive S and curing that follows. This means that the surface of adhesive S is forced to shrink. As the adhesive strength of adhesive S increases with time, adhesive S and reinforcing plate H, as well as adhesive S and chip portion C, are bound to each other.

In general, chip portion C tends to be deformed because the surface area of chip portion C is thin, and thereby there is limited stiffness. Therefore, bonding surface C1 of chip portion C, which is in contact with upper surface S1 of adhesives S, contracts when adhesive S suffers a volumetric (an areal) contraction with the force that is shown by arrow A in FIG. 1B. As a result, chip portion C is deformed so that it shrinks inwards. On the other hand, surface H1 of reinforcing plate H also contracts by adhesive S with the force that is shown by arrow B. However, reinforcing plate H is less subject to deformation than chip portion C because it is stiffer compared with that of chip portion C. Consequently, bonding surface C1 of chip portion C tends to shrink more than surface H1 of reinforcing plate H. In other words, the stacked structure consisting of chip portion C, reinforcing plate H, and adhesive S is bent such that chip portion C is bent with a smaller curvature than reinforcing plate H, or such that chip portion C is bent to form a convex, and the surface of reinforcing plate H to which adhesives S is not applied is bent to form a concave. Since such strain occurs in two directions in the plane of the stacked structure, chip portion C is in a stress state in which it is compressed from the circumferential portion toward the central portion, and chip portion C is deformed to form a concave in the central portion of chip portion C.

The strain that is induced in the chip portion in this way may cause undesired internal stress in the chip portion, may cause cracks that arise from the stress, and may promote extension of existing cracks. In particular, when an IC chip is incorporated into a non-contact IC card, the IC chip frequently experiences bending deformation during use. As a result, cracks may further extend, and, in the worst case, may cause breakage of the IC, resulting in considerable deterioration of reliability of IC chips.

Generally, adhesive strength that is required for an adhesive varies depending on the use. The requirement for adhesive strength is not so high for a chip portion that is used as an IC chip for a non-contact IC card, because the chip portion is often formed very thin in order to prevent thickness in a finished product. Moreover, an IC chip is covered with and fixed to a protective film, and is finally protected with a coating sheet. For these reasons, the requirement for adhesiveness is not so strict.

However, if an IC chip has a residual strain and is processed thinner, then the chip is more apt to experience cracks because of bending force in a reinforcing plate. Furthermore, if the bonding process is performed improperly, then an IC chip tends to experience chipping and cracks on the surfaces. Therefore, it is very important to prevent bending deformation, which is caused by volumetric contraction of the adhesive, in a chip portion of an IC chip that Is used as a non-contact IC card.

There also exist similar problems in various fields of IC chips other than the field of non-contact ICs. For example, ICs, when applied to cellular phones, need compact and high-density mounting in three-dimensional arrangements using methods such as piggyback stacking. However, such an arrangement tends to cause strain due to the stress in an adhesive during the process for stacking, and the strain that is caused may affect the characteristics of an element. It is reported that an IC chip is more apt to suffer damage due to the influence of mechanical external force. Furthermore, there is the problem that the durability of an IC chip is deteriorated by an increase in temperature of an element that is caused by the decrease in thermal conductivity of an adhesive.

Moreover, ICs, when they are used as sensors, are requested to be processed thin in order to secure stable mounting, as well as to reduce the size of the IC chip. However, the element characteristics may be affected by the strain that is caused by a stress in an adhesive. Furthermore, a non-uniform adhesive may cause an increase and variation in temperature because of local heat buildup. In this case, it is reported that an offset drift may occur and stability may be spoiled.

Furthermore, there is another problem regarding thin wafers during the process of dicing a wafer. In general, in order to dice a wafer into chips, a protection tape is applied to the wafer by means of an organic resin, and the wafer is diced in that state. Such a method can prevent chipping during dicing and mitigate mechanical damage on an element. Since chipping tends to occur more frequently as a wafer becomes thinner, the necessity for a protection tape increases as a wafer becomes thinner. However, the protection tape, which may reduce thermal conductivity, if it remains on the wafer after the wafer is diced into chip portions, needs to be removed prior to attaching a reinforcing plate to the chip portion, leading to increase in steps and a reduction in yield.

Therefore, even if certain protection material is provided in order to prevent chipping, it is desirable that the protection material is used as a part of the product in order to allow easy handling of the separated pieces. In order to do so, it is desirable that the stress in protective layer due to contraction after curing is small so that a chip portion is not curved or does not experience strain after it is attached to a reinforcing plate, and, in addition, it is also desirable that the reduction in thermal conductivity and non-uniformity are limited.

SUMMARY OF THE INVENTION

It is an object of the present invention to provide an adhesive that can prevent bending deformation of a chip portion, which may occur due to volumetric contraction of the adhesive, when an IC chip is attached to a reinforcing plate, while securing thermal conductivity and sufficient adhesive strength.

It is another object of the present invention to provide a protective film which can prevent chipping when a wafer is diced into IC chips, and which can secure thermal conductivity.

It is yet another object of the present invention to provide a method for manufacturing an IC chip through the step of dicing a wafer and applying a chip portion to a reinforcing plate using such an adhesive and a protective film.

An adhesive according to the present invention comprises a base material which generates adhesive strength through curing, a hardening agent which promotes the curing of the base material, and a filler. In order to solve the problems mentioned above, the adhesive is made of particles having a maximum particle diameter of 0.8 µm or less.

Since, substantially the entire filler consists of fine particles having a particle diameter of about 0.8 µm or less in such an adhesive, the filler is allowed to be uniformly distributed in the adhesive. If the base material is cured without filler, it will experiences volumetric contraction, but if filler is used, it will work to resist volumetric contraction. As a result, out-of-the-plane bending deformation, which is caused by the volumetric contraction of the adhesive, can be prevented in objects which are bonded together with the adhesive.

The adhesive may serve as a protective film for a wafer when the wafer is separated into chip portions.

A method for attaching a thin plate to a board according to the present invention comprises the steps of: applying the above mentioned adhesive to the board attaching the thin plate to the board to which the adhesive is applied; and bonding the thin plate and the board through curing of the adhesive.

The method may further comprise a step of providing at least one recess on the board prior to the step of applying the adhesive, wherein the recess is provided on an area of the board via which the thin plate and the board are to be bonded. The adhesive may be filled into the recess in the step of applying the adhesive.

The method may further comprise, prior to the step of applying the adhesive: a step of making a wafer thinner, a step of applying the above mentioned adhesive on the wafer as a protective film for the wafer, the wafer having been made thinner; a step of dicing the wafer into the thin plates, wherein the protective film is applied to the wafer.

As explained above, the adhesive according to the present invention can prevent bending deformation of a chip portion, which may occur due to volumetric contraction of the adhesive, when an IC chip is attached to a reinforcing plate, while at the same time the adhesive retains its thermal conductivity and sufficient adhesive strength. More generally, a similar effect can be expected when a thin plate is attached to a board, and improved reliability can be achieved for an IC chip or for a thin plate that is attached. Moreover, the adhesive of the present invention, when used as a protective film for a wafer that is to be diced, can prevent chipping and can remain, as it is, leading to an advantage in the manufacturing process.

The above and other purposes of the present invention, the feature, and an advantage will become clear from the following explanation which refers to the drawing of the attachment which illustrated the present invention.

DETAILED DESCRIPTION OF THE INVENTION

First, explanation will be given about the adhesive of the present invention The adhesive has an epoxy resin as a base material, which generates adhesive strength after curing at high temperature, a hardening agent which promotes the curing of the base material, and a filler which improves thermal conductivity of the adhesive.

There is no particular restriction against the composition of the resin, as long as the resin is a compound which has two or more epoxy groups in one molecule, and therefore, resins of a general type, such as bisphenol F, phenylglycidyl ether and so on, can be used. Although it is preferable that epoxy resins are liquid at normal temperature, epoxy resins which are liquefied with a solvent can also be used.

There is no particular restriction against the composition of the hardening agent, as long as the hardening agent rapidly reacts with an epoxy resin and is excellent in long-term stability after curing, and therefore, hardening agents of a general type, such as a latent amine compound, a phenolnovolac compound and so on, can be used.

As for a filler, fillers that have high thermal conductivity are desirable, taking into consideration that they function as a heat sink for the reinforcing plate. Silica is an especially desirable material. However, fillers consisting of silver, carbon, or copper, or fillers that include at least either of silica, silver, carbon, or copper may also be used.

The filler is in the form of powder that is made of the corresponding material, and may be in the form of a sphere, an ellipsoid, a scale-like shape, a pillar, a square pillar etc. The filler preferably has the maximum length of the major axis of about 0.8 μm or less, but more preferably has the maximum length of the major axis of about 0.6 μm or less. The length of the maximum major axis refers to the dimension of the longest side among the width, the depth and the height in the above-mentioned shape, and, in this specification, the term 'particle diameter' is interchangeably used for the maximum length of the major axis. It is desirable that particles which exceed the above-mentioned particle diameters are not contained in the filler, and it is important that substantially the entire filler consists of fine particles having a particle diameter of about 0.8 μm or less. There is no particular restriction against the amount of the filler. However, a weight ratio between 10 and 40 will be desirable. Although the weight ratio depends on particle diameters, smaller particle diameters are more effective for preventing bending strain in a chip portion for fillers having similar weight ratios, as will be mentioned later.

Figure 2A:
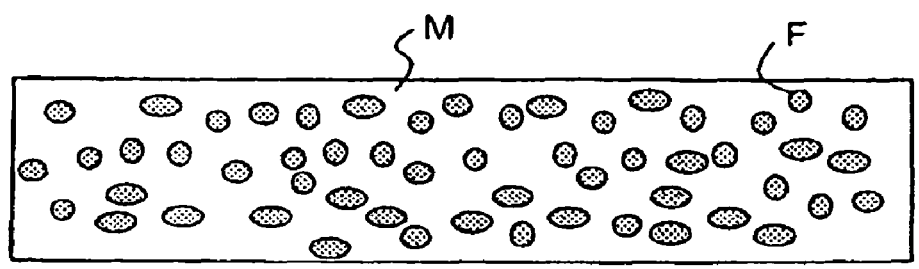
FIGS. 2A and 2B are schematic diagrams showing the distribution of fillers in adhesives of the present invention and prior art.
Figure 2B:
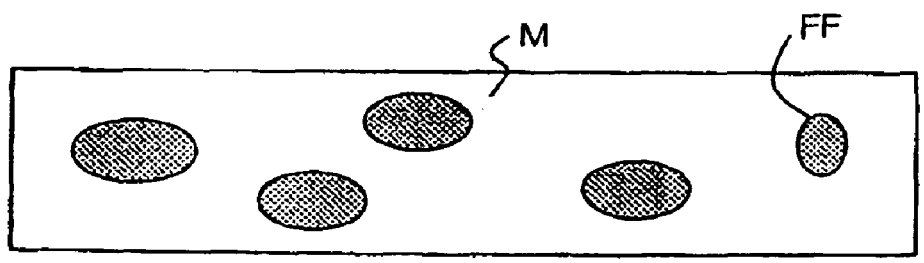

Next, the mechanism by which bending deformation in a bonded object is prevented by using a pulverized filler will be explained. FIG. 2A is a schematic diagram showing the distribution of a filler in an adhesive. Adhesive S consists of resin mixture M which consists of a base material and a hardening agent, and filler F that is distributed in resin mixture M. FIG. 2B is a schematic diagram for comparative purposes showing the distribution of a filler, which has particles having comparatively large diameters, in an adhesive according to prior art. The particle diameter of filler FF in FIG. 2B is larger than filler F of the present invention by one order of magnitude. Both figures are depicted on the supposition that the weight ratios of Fillers F and FF are similar.

Resin mixture M, when contracting due-to curing, must contract against the resistance of filler F which does not experience volumetric contraction. Specifically, resin mixture M receives resistant force on the surface of Filler F. This force is considered to be shear resistant force, although it depends on the direction in which the resin mixture contracts and on the form of Filler F. The resistant force works such that the contraction of resin mixture M is interrupted. The total area of the surface of a filler which is in contact with resin mixture M increases for a filler that is pulverized more finely, as shown in FIG. 2A, than for filler FF shown in FIG. 2B. Consequently, it is considered that resin mixture M receives a large resistant force during contraction in accordance with the degree of pulverization, resulting in reduction in contraction. In other words, when the filler is not finely pulverized, the adhesive is dotted with large particles of the filler in limited areas, and large portions of resin mixture M that do not contain any filler can contract without receiving a resistant force. However, when the filler is finely pulverized, the adhesive is dotted with small particles of filler in all portions of the adhesive, and there is smaller contraction in all portions.

Moreover, effect of preventing contraction of resin mixture M increases in accordance with the increase in the weight ratio of filler F. This is not only because the above-mentioned effect increases in proportion to the amount of filler, but also because the weight ratio of mixture M decreases in accordance with an increase in the amount of filler F. Too high a weight ratio of filler F may cause reduction in adhesive strength, but this is not a major problem for applications which does not need large adhesive strength, such as in the case of the above-mentioned non-contact IC card.

Figure 3:
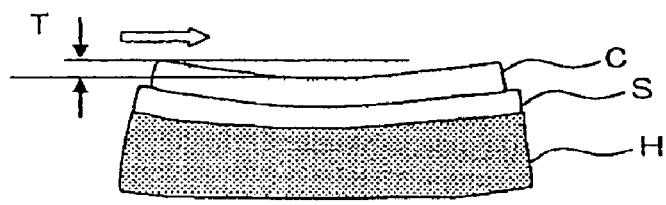
FIG. 3 is a schematic diagram showing a method for measuring deformation of an IC chip.
Figure 4:
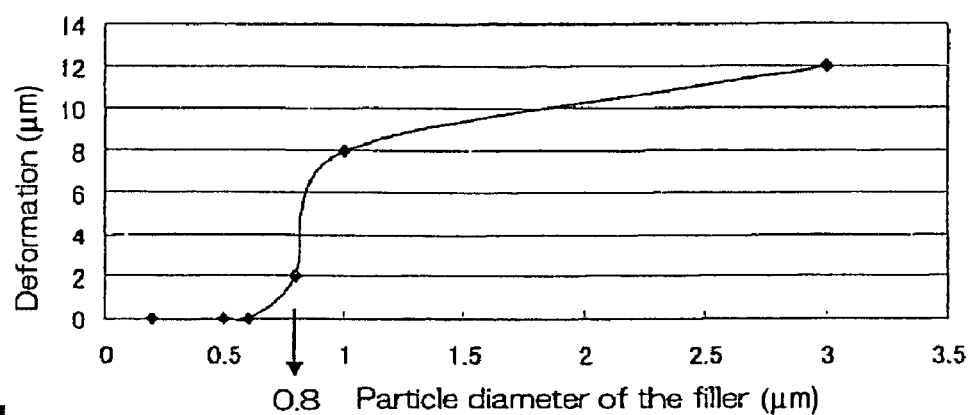
FIG. 4 is a diagram showing the relation between the particle diameter of the filler and the deformation of the IC chip that is measured.

Next, in order to quantitatively evaluate how fine a filler should be pulverized, a reinforcing plate, which is made of stainless steel and which has a planar size of 5 mm×6 mm and a thickness of 0.2 mm, was bonded with a chip portion, which has a planar size of 4 mm×5 mm and a thickness of 0.05 mm, with an adhesive which consists of a base material made of an epoxy resin, a hardening agent, and a filler. The base material is made of three kinds of amino phenol-based resins containing CAS (Chemical Abstracts Service) No. 124358-36-7 as the main component. The hardening agent is made of a denatured aliphatic poly amine-based resin. The filler is made of silica, and the adhesive was applied with a thickness of 10 μm. The adhesive had a viscosity of 43 Pa·s and an elastic modulus of 8.5 GPa. The particle diameter of the filler was increased step by step from the maximum of 0.2 μm to the maximum of 3 μm, as shown in FIG. 4, and deformation of IC chips in the direction of thickness was measured after the adhesive was cured with heat. The adhesive was heated at 120 degrees centigrade for 2 hours. As shown in FIG. 3, the surface height of the upper surface of the chip portion was measured from the circumference of the chip portion to the central portion, as depicted by the white arrow, using a surface roughness measuring device, and deformation T was calculated as the difference.

The result of the measurement is shown in Table 1 and FIG. 4. Table 1 shows the relation between the particle diameter of the filler and the deformation that was measured, and FIG. 4 shows the content of Table 1 in the form of a graph. Deformation did not occur for the filler having a maximum particle diameter of 0.6 µm or less. The deformation is quite small for filler having a maximum particle diameter of 0.8 µm. However, the deformation is sharply increased for filler having a maximum particle diameter that exceeds 0.8 µm. Thus, it is desirable that the filler has a maximum particle diameter of 0.8 µm or less, and it is more desirable that the filler has a maximum particle diameter of 0.6 µm or less.

TABLE 1

| Particle diameter of the filler (µm) | Deformation (µm) |
| --- | --- |
| 0.2 | 0 |
| 0.5 | 0 |
| 0.6 | 0 |
| 0.8 | 2 |
| 1 | 8 |
| 3 | 12 |

Next, explanation will be given about a method for attaching a chip portion to a reinforcing plate using the adhesive mentioned above.

First, a wafer, not shown, having many chip portions C on a silicon substrate was manufactured. Then, the wafer is ground from the surface opposite to the surface on which chip portions C were formed. The thickness of wafer W, which is about 0.65 mm in one example, is decreased by means of, for example, mechanical polishing, and finally decreased to 0.1 mm or less, or about 75 µm or less in another example, by means of chemical etching. Next, after a processing tape, not shown, is applied to the wafer in order to stabilize the wafer, the wafer is diced into a plurality of chip portions C by means of a grindstone, not shown. In another embodiment, the above-mentioned adhesive may be applied as a protective film instead of providing the processing tape, as will be later described in detail.

Figure 1A:
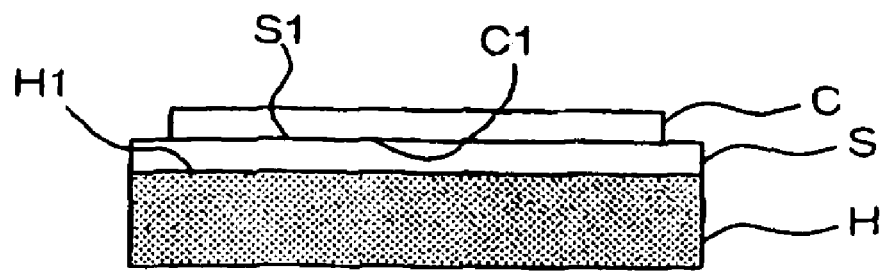
FIGS. 1A and 1B are sectional views of a chip portion, an adhesive, and a reinforcing plate when the chip portion is attached to the reinforcing plate using prior art.
Figure 1B:
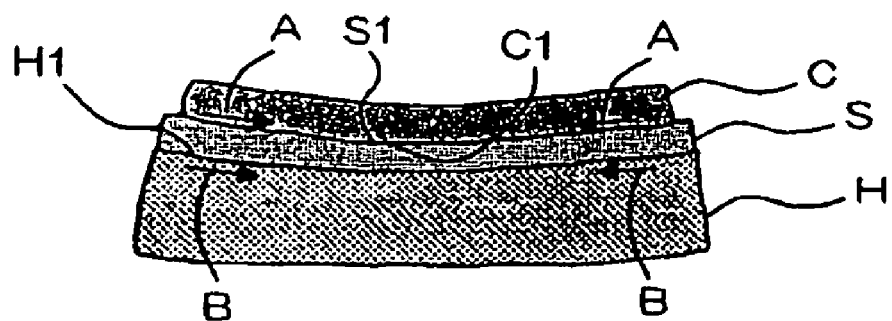

Next, a plurality of reinforcing plates H, which are made of stainless steel, are formed. After reinforcing plates H are held to a base plate, not shown, with a double-sided adhesive tape etc, adhesive S, having a thickness of 50 µm or less in one embodiment, is applied to reinforcing plates H. Next, chip portions C are attached to adhesive S. Specifically, the surface of chip portion C that is opposite to the side on which an element is formed (the side on the substrate of a wafer) comes in contact with the surface of adhesive S, similarly to FIG. 1A. Next, the entire structure is heated to make adhesive S cure. Heating at 120 degrees centigrade for about 2 hours is required in order to make an epoxy resin. During heating, reinforcing plate H, adhesive S, and chip portion C are cured without experiencing out-of-the-plane deformation, i.e., while substantially keeping the state shown in FIG. 1A, by virtue of the effect of the adhesive according to the present invention. Then, reinforcing plates H are separated from the base plate. Through these steps, manufacturing of an IC chip, which has reinforcing plate H and chip portion C that is attached to reinforcing plate H, is completed.

Figure 5A:
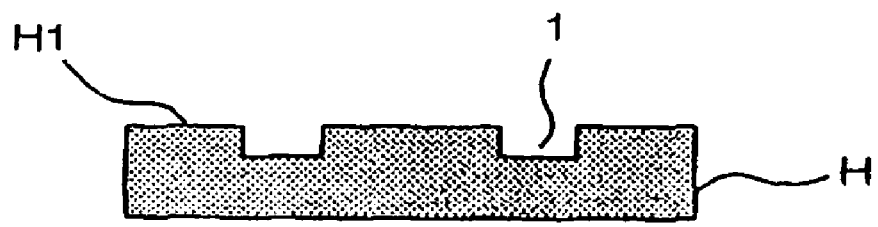
FIGS. 5A and 5B are schematic diagrams showing a modified application surface of a reinforcing plate.
Figure 5B:
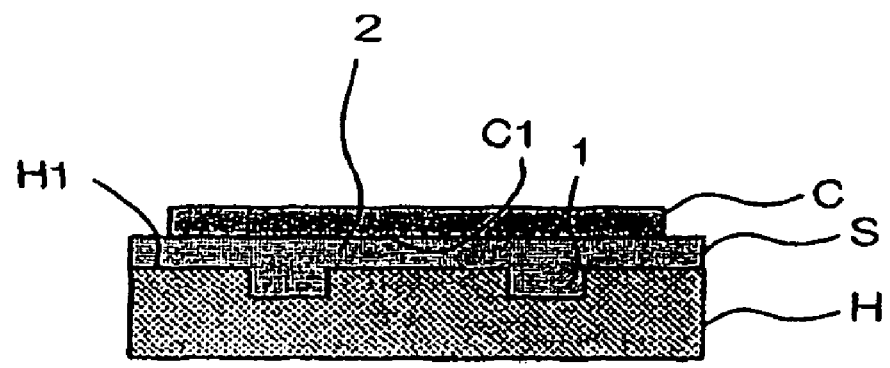

In the steps described above, recess 1 may be formed on surface H1 of reinforcing plate H, as shown in FIG. 5A, and adhesive S may be filled into recess 1, as shown in FIG. 5B. Even if particles of a filler having larger particle diameters compared with the suitable particle diameter mentioned above are contained in adhesive S, the particles having larger diameters are caught in recess 1 when adhesive S is spread on surface H1, and fall into recess 1 due to gravity. Therefore, adhesive S is allowed to contain only particles with suitable particle diameters in planar area 2, which is the area other than recess 1 in which surface H1 and bonding surface C1 of chip portion C are opposite to each other. As a result, the adhesive strength of adhesive S for reinforcing plate H can be improved, and, in addition, flow of adhesive S is promoted and generation of air bubbles is prevented by recess 1. Moreover, the viscosity of adhesive S in planar area 2 is increased because the filler mainly contains finer particles in planar area 2. This prevents cracks in the adhesive layer and allows smooth seeping of adhesive $ when adhesive 3 is pressed for bonding. The latter also contributes to prevent air bubbles from entering adhesive S.

Table 2 shows the result of measuring the adhesive strength for structures with and without a recess. The adhesive strength was measured for an adhesive that contains a silver filler (70-90 wt %) with a maximum particle diameter of 0.8 µm and that was applied with a thickness of 30 µm. It is confirmed that the recess enhances adhesive strength, though the result depends on the pitch and the shape of the recess.

TABLE 2

|  | Without recesses | With recesses (1) | With recesses (2) | With recesses (3) |
| --- | --- | --- | --- | --- |
| Pitch of recesses | — | 30 µm | 60 µm | 100 µm |
| Depth of recesses | — | 15 µm | 30 µm | 30 µm |
| Width of recesses | — | 20 µm | 30 µm | 50 µm |
| Sample #1 | 1.23 | 1.59 | 2.03 | 1.98 |
| Sample #2 | 0.98 | 1.84 | 2.11 | 2.03 |
| Sample #3 | 1.34 | 1.99 | 2.41 | 2.26 |

Unit kg/mm$^2$

Figure 6:
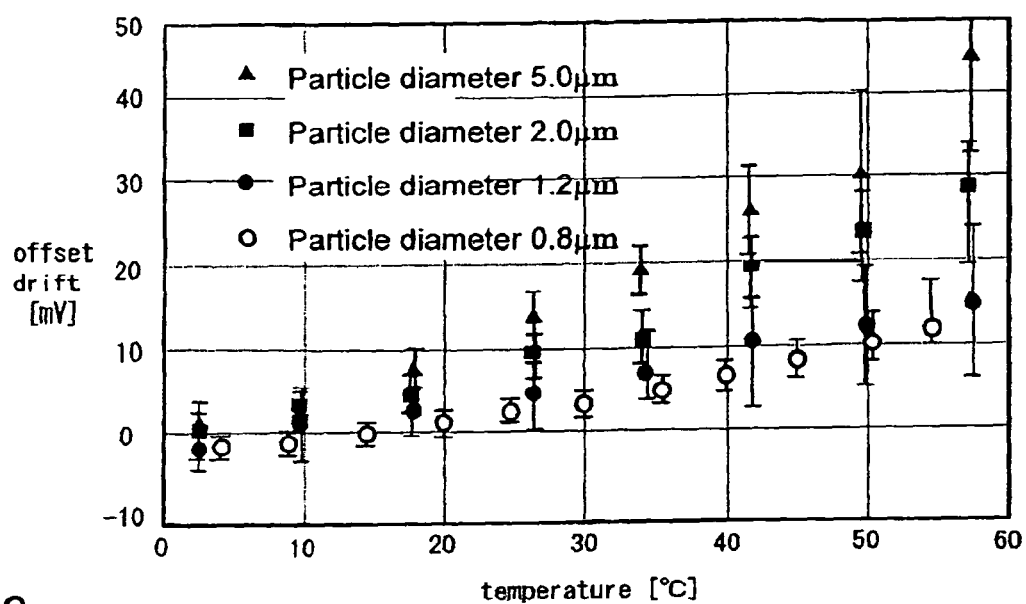
FIG. 6 is a graph showing the relation between the particle diameter of the filler and the offset variation of the sensor.

FIG. 6 shows the relation between the particle diameter of a filler and the offset drift when an adhesive of the present invention was used to attach a sensor chip to a base plate. The variation in bridge output of a sensor element due to temperature change as measured for an adhesive that contains a silver filler (70-90 wt %) and that was applied with a thickness of 30 µm. A voltage of 5V was applied between the bridges. Table 3 shows the variation in drift measured at 35 and 50 degrees centigrade. It is confirmed that the variation in drift is small for a particle diameter of 0.8 µm, whereas the variation increases for particle diameters of 1.2 µm or more, and accordingly, the adhesive of the present invention serves to stabilize the characteristics of drift of a sensor.

|  | Particle diameter | | | |
| --- | --- | --- | --- | --- |
|  | 0.8 µm | 1.2 µm | 2.0 µm | 5.0 µm |
| 35 deg. C. | 3.5 | 7.9 | 5.4 | 6.3 |
| 50 deg. C. | 5.5 | 12.4 | 13.4 | 18.1 |
| Average | 4.5 | 10.2 | 9.4 | 12.2 |

Unit mV

Tables 4, 5 show the yield for structures with and without a recess. An adhesive having a silver filler (70-90 wt%) was used. Table 4 shows the result when the adhesive was applied to a sensor bridge of the magneto-resistive effect thin film type, and the yield was evaluated based on the magnitude of drift to temperature and the offset value of sensors having a size of 180 µm×2 µm. Table 5 shows the result when the adhesive was applied to a digital IC having a size of 4 mm×4 mm. It is confirmed in both examples that yield is improved compared with structures not having recesses. In this way, cracks and air bubbles in an adhesive layer can be prevented and the yield of ICs and sensors can be improved by providing a recess in a base plate.

TABLE 4

|  | Without recesses | With recesses (1) | With recesses (2) | With recesses (3) |
| --- | --- | --- | --- | --- |
| Pitch of recesses | — | 30 μm | 60 μm | 100 μm |
| Depth of recesses | — | 15 μm | 30 μm | 30 μm |
| Width of recesses | — | 20 μm | 30 μm | 50 μm |
| Lot #1 | 93.4 | 97.4 | 98.7 | 97.6 |
| Lot #2 | 91.5 | 99.5 | 99.5 | 98.8 |
| Lot #3 | 96.8 | 97.5 | 100 | 99.4 |

Unit %

TABLE 5

|  | Without recesses | With recesses (1) | With recesses (2) | With recesses (3) |
| --- | --- | --- | --- | --- |
| Pitch of recesses | — | 30 μm | 60 μm | 100 μm |
| Depth of recesses | — | 15 μm | 30 μm | 30 μm |
| Width of recesses | — | 20 μm | 30 μm | 50 μm |
| Lot #1 | 98.5 | 99.2 | 99.8 | 98.7 |
| Lot #2 | 97.3 | 99.6 | 100 | 99.9 |
| Lot #3 | 98.2 | 98.9 | 100 | 99.6 |

Unit %

Then, the IC chip is washed and visual inspection is conducted. Next, the finished IC chip is mounted on an antenna circuit board together with an antenna for communication. A protective film is formed on the antenna circuit board in order to cover the IC chip and the antenna. Then, the protective film and the antenna circuit board are covered with a packaging sheet to complete a non-contact type IC card.

As will be understood from the foregoing, when a chip portion is attached to a reinforcing plate to form an IC chip, the resin mixture of an adhesive, which contains a filler having particles with a maximum particle diameter of 0.8 μm or less, is less subject to volumetric contraction. Consequently, the chip portion is less apt to experience significant bending deformation, and cracks which are caused by bending can also be prevented, leading to improved reliability of the IC chip, as well as of the non-contact IC card which has the IC chip.

Moreover, since the adhesive excels in thermal conductivity because of a silica filler, the adhesive can effectively transmit heat that is generated in a chip portion to the reinforcing plate which serves as a heat sink. In addition, manufacturing expenses are limited because silica powder is commercially available at a low cost.

Figure 7:
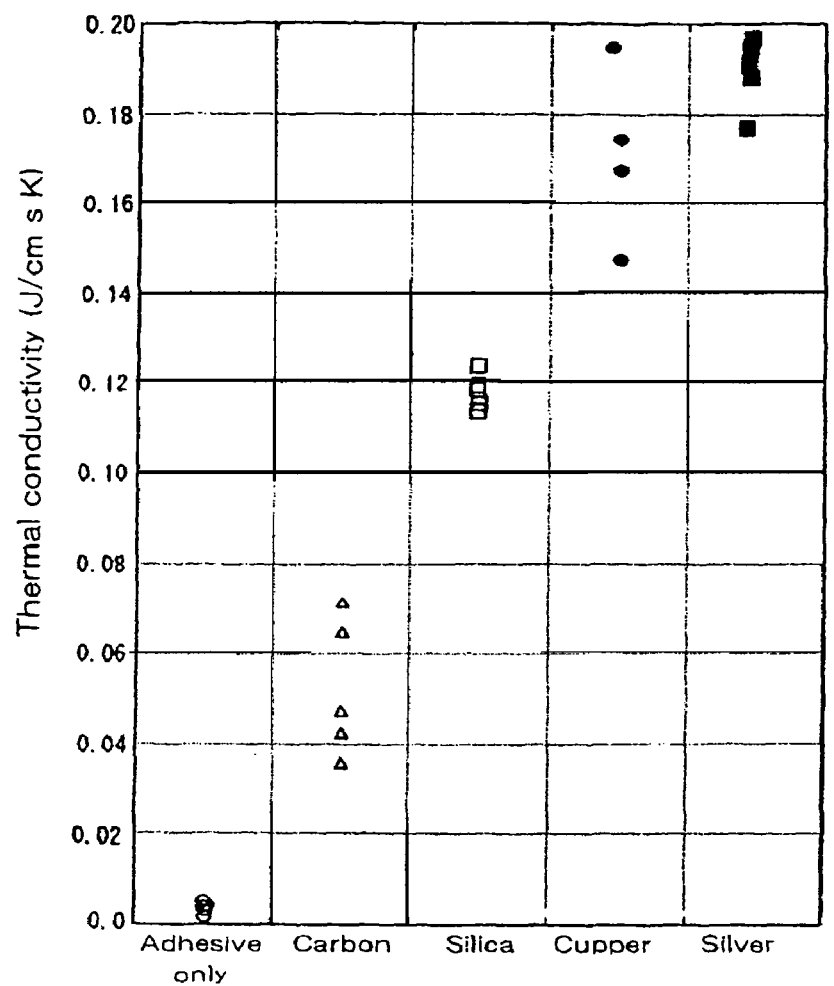
FIG. 7 is a graph showing the thermal conductivity of the adhesive of the present invention.
Figure 8:
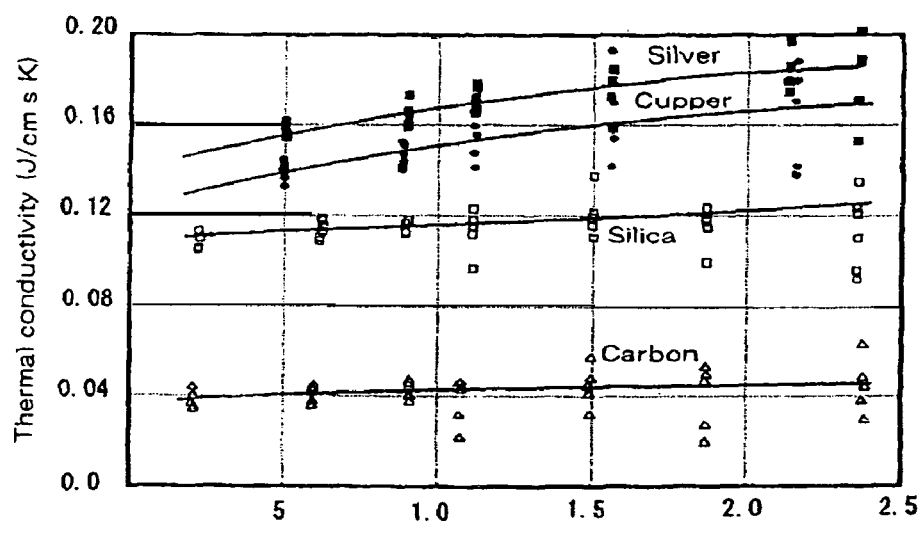
FIG. 8 is a graph showing the relation between the average particle diameter of the filler and thermal conductivity.

FIG. 7 shows the result of measuring thermal conductivity of an adhesive that contains a filler with 70-90 wt %. The particle diameters of the filler were between 0.5 μm and 0.8 μm, and thickness of the adhesive was 30 μm. Thermal conductivity was increased by 15 times or more as compared with an adhesive without the filler. FIG. 8 shows the relation between the average particle diameter of a filler and thermal conductivity. A filler with small particle diameters can promote uniformity of an adhesive, and prevent non-uniform or local increases in temperature. Thus, a filler that has uniform particles with a maximum particle diameter of 0.8 μm or less can prevent variation in the quality of ICs, and can stabilize the drift characteristics of sensors.

In addition, the adhesive and the method according to the present invention are not limited to the embodiments that are explained above. For example, any type of adhesive, such as ultraviolet curing resins, which experience volumetric contraction during curing, may be used instead of an epoxy resin. Moreover, if thermal conductivity is not as important as in the present embodiment and if electric conductivity is more important (for example, when a semiconductor device is attached to a substrate while being electrically connected to the substrate), then conductive fillers, such as silver or copper fillers, may be used. Furthermore, in order to obtain both thermal conductivity and electric conductivity, a silver filler may be used.

In the embodiment explained above, a wafer is diced into chip portions, and then each chip portion Is attached to a reinforcing plate. However, a wafer may be attached to a reinforcing plate, and then the combination of the wafer and the reinforcing plate may be diced into IC chips. In this case, an adhesive may also experience volumetric contraction and may cause strain in the wafer that is attached according to prior art. However, according to the present invention, bending deformation can be prevented.

Furthermore, needless to say, the present invention can be applied for more general purposes for attaching a thin plate, in regard to which bending deformation must be especially prevented, to a board.

Next, explanation will be given about a method for using the above-mentioned adhesive as a protective film instead of providing a processing tape. The adhesive that is used as a protective film is preferably made of a thermosetting epoxy resin or a phenolnovolac resin. The resin preferably includes particles having a maximum particle diameter 0.8 μm or less, which are made of either silicon, alumina, titanium carbide, or silica, or made of a compound that includes either silicon, alumina, titanium carbide, or silica. Such an adhesive significantly reduces contraction during curing, and therefore prevents curvature, deformation, and residual bending stress of a chip when it is processed and attached.

In one embodiment, after a wafer was attached to an adhesive tape and was processed to a thickness of 0.1 mm, a protective film was formed on the wafer that had been processed thin. Then, the protective film was cured to a hardness value of 13 or more according to the modified Mohr's scale of hardness. Table 6 shows the result of counting the number of chipping having a length of 10 μm or more in order to evaluate the performance of the protective film during dicing. It is desirable that the protective film has a thickness of 0.1 mm or less, and it is more desirable that it has a thickness between 0.03 mm and 0.05 mm, which is equivalent to 0.3 to 0.5 times the thickness of a chip portion.

TABLE 6

|  | Thickness of an adhesive layer (μm) | | | | | | | |
| --- | --- | --- | --- | --- | --- | --- | --- | --- |
|  | 10 | 20 | 30 | 40 | 50 | 100 | 150 | 200 |
| Sample #1 | 98 | 3 | 1 | 0 | 2 | 3 | 23 | 12 |
| Sample #2 | 86 | 1 | 0 | 1 | 1 | 12 | 42 | 76 |
| Sample #3 | 45 | 4 | 0 | 0 | 1 | 11 | 23 | 16 |
| Average | 76 | 3 | 0 | 0 | 1 | 9 | 29 | 35 |

A resin may be formed as a processing tape, and may be cured with heat. The protective film according to the present embodiment is less apt to experience thermal contraction, because it contains a filler which is similar to that in the-adhesive mentioned above. Therefore, a chip portion is less subject to bending stress. Tension is preferably not applied to the resin in order to prevent residual stress and thereby-to reduce curvature in a finished IC. This contributes to promote uniformity of the adhesive layer in later steps and to secure stable thermal conduction. Then, the wafer to which the protective film attached is diced.

Thus, chipping can be prevented by using a resin, which has a uniform filler with a maximum particle diameter of 0.8 μm or less, as a protective film. IC chips become more resistant against mechanical shock because membrane stress does not remain after separation. Moreover, since removal of the protective film is not necessary because of the excellent thermal conductivity, the protective film can be used together with other elements on an adhesive tape in later steps. The present embodiment is suitable for automation because there is no possibility that chips will be scattered after separation.

Although a certain preferred embodiment of the present invention has been shown and described in detail, it should be understood that various changes and modifications may be made without departing from the spirit or scope of the appended claims.

What is claimed is:

1. An IC chip comprising a chip portion bonded to a reinforcing plate by a cured adhesive composition interposed between said chip portion and said reinforcing plate;
    wherein prior to curing, said adhesive composition comprises:
    an epoxy resin base material having two or more epoxy groups per molecule;
    a hardening agent that promotes the curing of said epoxy resin base material; and
    a filler with a maximum particle diameter from 0.2 μm to 0.8 μm;
    wherein the reinforcing plate comprises a surface featuring recesses and planar areas, said recesses having a pitch of 30 μm to 100 μm, each recess having a depth ranging between 15 μm to 30 μm and a width ranging between 20 μm to 50 μm;
    wherein the cured adhesive composition is filled into said recesses and provided on said planar areas; and
    wherein the filler of the cured adhesive provided on said planar areas has a maximum particle diameter from 0.2 μm to 0.8 μm.

2. The IC chip according to claim 1, wherein the chip portion is a sensor chip.

3. The IC chip according to claim 2, wherein said recesses face upwards.

4. The IC chip according to claim 1, wherein said recesses face upwards.

5. The IC chip according to claim 1, wherein the chip portion further comprises a protective film of a cured adhesive composition, wherein prior to curing, said adhesive composition comprises:
    an epoxy resin base material having two or more epoxy groups per molecule;
    a hardening agent that promotes the curing of said epoxy resin base material; and
    a filler with a maximum particle diameter from 0.2 μm to 0.8 μm.

6. The IC chip according to claim 5, wherein said protective film has a thickness which ranges between 0.3 times and 0.5 times the thickness of the chip portion.

7. A method of making the IC chip of claim 1, said method comprising the steps of:
    providing recesses on a surface of a reinforcing plate, yielding the reinforcing plate comprising a surface featuring recesses and planar areas;
    applying an adhesive composition to the reinforcing plate, such that the adhesive composition is filled into said recesses and provided on said planar areas;
    contacting a chip portion with the applied adhesive composition; and
    bonding the chip portion to the reinforcing plate by curing the adhesive composition.

8. The method according to claim 7, wherein the adhesive composition is applied to the reinforcing plate, such that the adhesive composition is filled into said recesses and provided on said planar areas, with the recesses facing upwards.

9. A method of making the IC chip of claim 5, said method comprising:
    forming a chip portion further comprising a protective film of a cured adhesive composition, by: providing a wafer having chip portions on a silicon substrate; decreasing the thickness of the wafer; applying the adhesive composition to the wafer; curing the adhesive composition to form the protective film on the wafer; and dicing the wafer into chip portions;
    providing recesses on a surface of a reinforcing plate, yielding the reinforcing plate comprising a surface featuring recesses and planar areas;
    applying the adhesive composition to the reinforcing plate, such that the adhesive composition is filled into said recesses and provided on said planar areas;
    contacting the chip portion with the applied adhesive composition; and
    bonding the chip portion to the reinforcing plate by curing the adhesive composition.

10. The method according to claim 9, wherein the protective film of the cured adhesive composition has a hardness value of 13 or more, according to the modified Mohr's scale of hardness.

11. The method according to claim 9, wherein the protective film of the cured adhesive composition has a thickness between 0.3 times and 0.5 times the thickness of the chip portion.

12. The method according to claim 9, wherein the adhesive composition is applied to the reinforcing plate, such that the adhesive composition is filled into said recesses and provided on said planar areas, with the recesses facing upwards.

* * * * *